United States Patent
Ogura

(10) Patent No.: US 7,463,661 B2
(45) Date of Patent: Dec. 9, 2008

(54) QUANTUM NANO-STRUCTURE SEMICONDUCTOR LASER

(75) Inventor: Mutsuo Ogura, Ibaraki (JP)

(73) Assignees: National Institute of Advanced Industrial Science and Technology, Tokyo (JP); Japan Science and Technology Agency, Kawaguchi-shi (JP)

( * ) Notice: Subject to any disclaimer, the term of this patent is extended or adjusted under 35 U.S.C. 154(b) by 39 days.

(21) Appl. No.: 10/505,770

(22) PCT Filed: Feb. 24, 2003

(86) PCT No.: PCT/JP03/01975

§ 371 (c)(1),
(2), (4) Date: Nov. 1, 2005

(87) PCT Pub. No.: WO03/073570

PCT Pub. Date: Sep. 4, 2003

(65) Prior Publication Data

US 2006/0056472 A1    Mar. 16, 2006

(30) Foreign Application Priority Data

Feb. 27, 2002    (JP) .............................. 2002-051548

(51) Int. Cl.
   *H01S 5/00*    (2006.01)
(52) U.S. Cl. ................................ 372/44.01; 372/43.01
(58) Field of Classification Search ............... 372/43.01, 372/44.01
   See application file for complete search history.

(56) References Cited

U.S. PATENT DOCUMENTS 4,302,729 A    11/1981    Burnham et al.
(Continued)

FOREIGN PATENT DOCUMENTS

EP    406005    1/1991
(Continued)

OTHER PUBLICATIONS

Toda et al, "Fabrication of InGaAs/GaAs DFB Quantum Wire Lasers Using V-grooved Substrates" Conference Proceedings. 1998 International Conference on Indium Phosphide and Related Materials, 1998, pp. 349-352.*

(Continued)

*Primary Examiner*—Minsun Harvey
*Assistant Examiner*—Patrick Stafford
(74) *Attorney, Agent, or Firm*—Oblon, Spivak, McClelland, Maier & Neustadt, P.C.

(57) ABSTRACT

On a grooved semiconductor substrate having a plurality of V-grooves individually extended in directions perpendicular to a direction Is of advance of an oscillated laser beam and mutually disposed in parallel along the direction Is of advance of the laser beam, a plurality of quantum wires (11) are formed on the V-grooves by selective growth of a Group III-V compound. The plurality of quantum wires are adapted to serve as limited-length active layer regions mutually disposed in parallel along the direction Is of advance of the laser beam with a period of an integer times of a quarter wavelength in a medium of a laser active layer and individually corresponding to stripe widths of laser. Consequently, a quantum nano-structure semiconductor laser satisfying at least one, or preferably both, of the decrease of a threshold and the stabilization of an oscillation frequency as compared with a conventional countertype can be provided.

11 Claims, 5 Drawing Sheets

U.S. PATENT DOCUMENTS

| | | | | |
|---|---|---|---|---|
| 5,077,752 | A | * | 12/1991 | Tada et al. .................... 372/96 |
| 5,529,952 | A | * | 6/1996 | Smith et al. ................. 438/380 |
| 5,917,194 | A | * | 6/1999 | Dutta et al. ................... 257/17 |
| 6,205,165 | B1 | * | 3/2001 | Yamamoto et al. ............ 372/96 |

FOREIGN PATENT DOCUMENTS

| | | | |
|---|---|---|---|
| EP | | 494765 | 7/1992 |
| EP | | 553994 | 8/1993 |
| EP | | 905837 | 3/1999 |
| EP | | 905837 A2 * | 3/1999 |
| JP | | 59-48975 | 3/1984 |
| JP | | 3-49283 | 3/1991 |
| JP | | 5-145169 | 6/1993 |
| JP | | 6-275908 | 9/1994 |
| JP | | 11-330619 | 11/1999 |
| JP | | 2000-124441 | 4/2000 |
| JP | | 2000-352614 | 12/2000 |
| JP | | 2001-284712 | 10/2001 |
| JP | | 2001-326421 | 11/2001 |
| JP | | 2002-204033 | 7/2002 |

OTHER PUBLICATIONS

Ishida et al, "Seeded self-assembled GaAs quantum dots grown in two-dimensional V grooves by selective metal organic chemical-vapor deposition" Applied Physics Letters, vol. 72, No. 7, Feb. 16, 1998, pp. 800-802.*

Notzel, Richard et al. "Device quality submicron arrays of stacked sidewall quantum wires on patterned GaAs (311)A substrates" Applied Physics Letters. vol. 72, No. 16 Apr. 20, 1998, pp. 2002-2004.*

Toda et al. "Fabrication on InGaAs/GaAs DFB Quantum Wire Lasers Using V-Grooved Substrates", 10th Intern. Conf. on Indium Phosphide and Related Materials, pp. 349-352 1998.

Noetzel et al. "Device quality submicron arrays of stacked sidewall quantum wires on patterned GaAs (311)A substrates", Applied Physics Letters, vol. 72, No. 16, pp. 2002-2004 1998.

Ishida et al. "Seeded self-assembled GaAs quantum dots grown in two-dimensional V grooves by selective metal-organic chemical-vapor deposition", Applied Physics Letters, vol. 72, No. 7, pp. 800-802.

Constantin et al. "Influence of strain and quantum confinement on the optical properties of InGaAs/GaAs V-groove quantum wires", Journal of Applied Physics, vol. 88, No. 1, pp. 141-147 2000.

Tae Geun Kim et al. "Performance of AlGaAs/GaAs quantum wire lasers fabricated on sub-μm-pitch gratings: in both distributed feed-back-and wire-directions", Lasers and Electro-Optics Europe, Conference Digest. CMC6 2000.

Chan Sik Son et al. "Constant growth technique for vertical-stacked AlGaAs/GaAs quantum wires on submicron gratings", The 7th International Workshop on Femtosecond Technology, Abstract of the 7th International Workshop on Femto Second Technology, FC-46, p. 196 2000.

Chan Sik Son et al. "Constant growth of V-groove AlGaAs/GaAs multilayers on submicron gratings for complex optical devices", Journal of Crystal Growth, vol. 221, No. 1/4, pp. 201-207 2000.

Yasuhiko Tanuma et al. "III-zoku Genshi Hyomen Kakusan Seigyo MBE ni yoru InGaAs Ryoshi Saisen no Sakusei", The Institute of Electronics, Information and Communication Engineers Gijutsu Kenkyu Hokoku, vol. 98, No. 385, pp. 13-18, CMP98-129 1998.

Takeyoshi Sugaya et al. "MBE ni okeru As2 o mochiita V-Mizojo InGaAs/InAlAs Ryoshi Saisen no Sakusei", Dal 44 kal Oyo Butsurigaku Kanren Rengo Koenkai Yokoshu, separate vol. 0, p. 1332, 29a-T-10 1997.

J.K. Kim et al. "Design parameters for lateral carrier confinement in quantum-dot lasers", Applied Physics Letters, vol. 74, No. 19, pp. 2752-2754 1999.

York, P.K. et al. "MOCVD regrowth over GaAs/AlGaAs gratings for high power long-lived InGaAs/AlGaAs lasers", Journal of Crystal Growth, vol. 124, pp. 709-715 1992.

Kim, J.K. et al . "Design parameters for lateral carrier confinement in quantum-dot lasers", Applied Physics Letters, vol. 74, No. 19, pp. 2752-2754 1999.

Wang, Xue-Lun et al. "Fabrication of highly uniform AlGaAs/GaAs quantum wire superlattices by flow rate modulation epitaxy on V-grooved substrates", Journal of Crystal Growth, vol. 171, pp. 341-348 1997.

Son, Chang-Sik et al. "Constant growth of V-groove AlGaAs/GaAs multilayers on submicron gratings for complex optical devices", Journal of Crystal Growth, vol. 221, pp. 201-207 2000.

Zou, Z. et al. "Ground state lasing from a quantum-dot oxide-confined vertical-cavity surface-emitting laser", Applied Physics Letters, vol. 75, No. 1, pp. 22-24 1999.

* cited by examiner

F I G. 1(A)
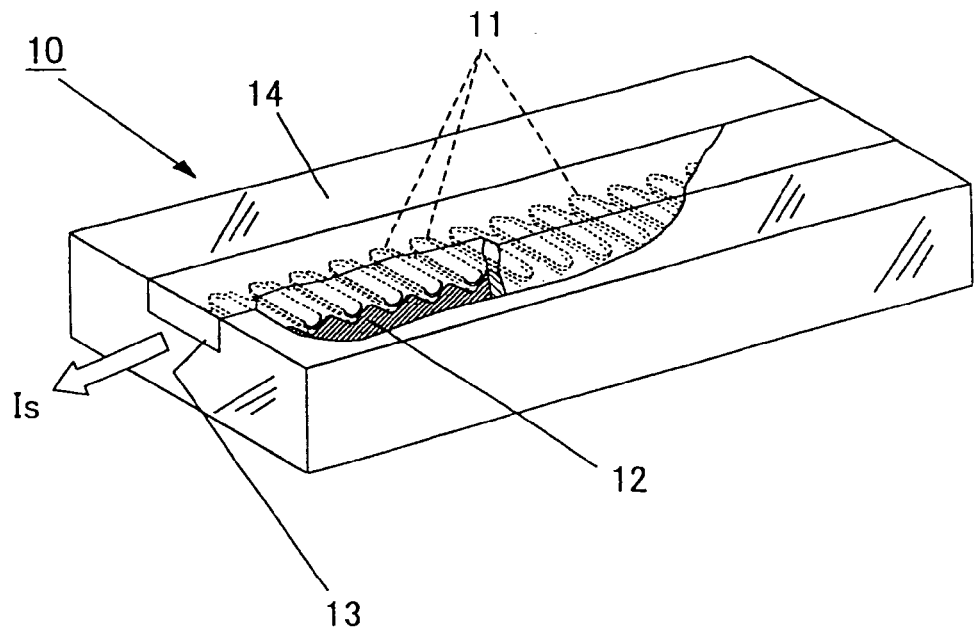
F I G. 1(B)
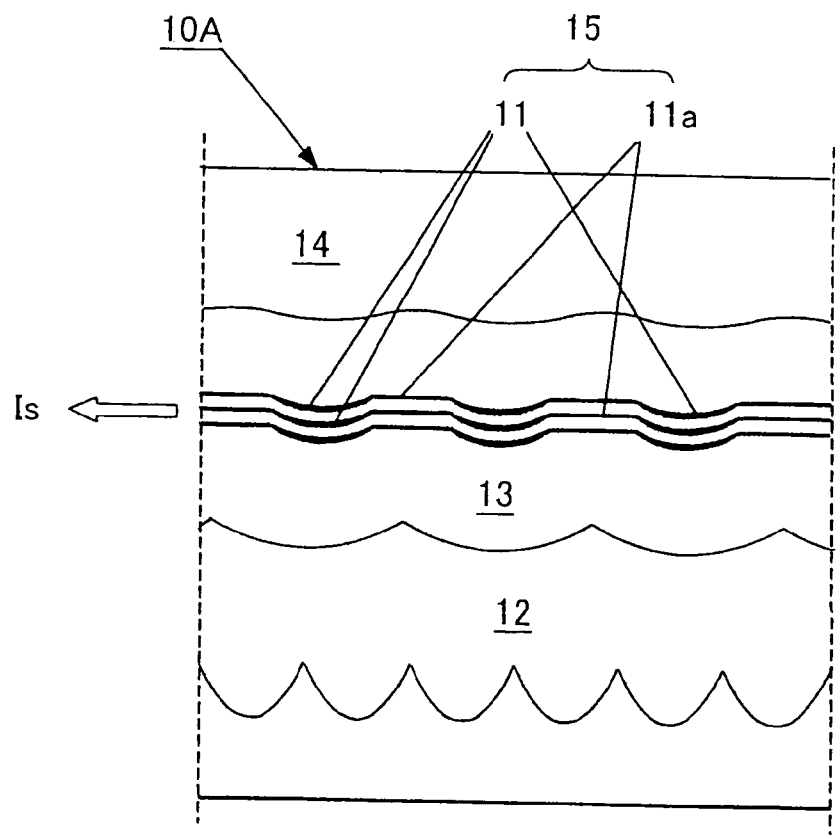

QUANTUM NANO-STRUCTURE SEMICONDUCTOR LASER

TECHNICAL FIELD

This invention relates to a quantum nano-structure semiconductor laser that is particularly effective for application to a distributed feedback (DFB) semiconductor laser and to improvements in and concerning a quantum nano-structure array applicable significantly to various optically functioning devices.

BACKGROUND ART

In the semiconductor lasers, the distributed feedback semiconductor laser that is provided in the direction of advance of a waveguide with periodic structures for refractivity and gain will discharge a very important role as a device for use in the future Wavelength Division Multiplexing (WDM) operation in respect that it is capable of controlling an oscillating wavelength exactly and it facilitates integration because it obviates the necessity of a step of cleavage indispensable as in the Fabry-Perot laser.

The first problem that is encountered by the distributed feedback semiconductor laser pertains to simplification of the process of production thereof In the initial stage of its development, it was customary to form a lower clad layer, a lower guide layer, an active layer and an upper guide layer from a substrate upward in the first cycle of the process of crystal growth, curve gratings conforming to the wavelength in a waveguide on the upper guide layer, and form an upper clad layer on a guide layer having a periodic structure in the second cycle of the crystal growth (refer, for example, to Document 1: P. K. York, J. C. Connolly et al, "MOCVD regrowth over GaAs/AlGaAs gratings for high power long-lived InGaAs/AlGaAs lasers," Journal of Crystal Growth 124 (1992) 709-715).

Further, for the purpose of securing the confinement of carriers and optical field in the lateral direction, stripes are formed along an optical waveguide by means of wet etching through a silicon dioxide mark, and lateral surfaces of the stripes are embedded with a current blocking layer and an ohmic contact layer by the third cycle of growth. It is often the case that the fourth cycle of growth is necessary to flatten the device surface after removing the silicon dioxide mark used for the third selective growth.

Such multiple cycles of lithography and crystal growth results in boosting the cost of production and impeding the dissemination of the product in industry. Further, since the re-growth interface exists in the neighborhood of the active layer, it causes an additional leak path of the drive current and increases the threshold current. The technique of this nature, therefore, has its limits in terms of principle and cannot continue to be similarly useful in the future.

In contrast, the quantum nano-structure semiconductor laser using quantum wires and quantum dots in the active domain has been found to possess various great merits besides the quantum effect initially expected. In the case of the quantum dots, for example, particularly since the dots are embedded with a material of a broad band gap, they can confine therein a carrier and, by virtue of a simple alteration of the conditions for crystal growth, can aim at attaining an addition to the function without entailing an increase in the cost of production. The merit of this nature suggests the possibility of proving extremely advantageous for the construction of semiconductor lasers that will find utility fiber to home age to arrive shortly.

The present inventors, therefore, have hitherto studied processes for the production of quantum wires and have searched stepwise for new processes to redue the device production cost while maintaining the device performance. Generally, the quantum nano-structure such as a quantum wire or quantum dots with a narrow band gap material embedded in a wide band gap material to form a clad layer in a size of several nm equaling the de Broglie wavelength of an electron has a density of stress concentrated on a specific energy level and, therefore, befits the realization of a high performance optical devices. Even for the sake of clearing the problem regarding a process complexity of device production, therefore, it is more rational to aim at realizing such a quantum nanostructure configuration. That is, in having quantum wires integrated at a high density in a positional relation of a specific regularity, it is ideal to realize this integration by one time crystal growth. The realization of this integration results in rational realization of a semiconductor laser allowing control of wavelength and a supersaturated absorber necessary for self-starting oscillation of an ultrahigh speed solid laser.

For the sake of confining light in a semiconductor waveguide, it is necessary that the upper and lower clad layers should be formed at least in a thickness in the approximate range of 0.5 to 1 µm. When a grating is formed on a substrate and a lower clad layer of such a thickness is grown and, even thereafter, the grating is allowed to retain a satisfactory shape on the surface of the lower clad layer, then it is made possible to form an active layer approximating closely to the grating of the clad layer by one time crystal growth and consequently simplify a process for the fabrication of a distributed feedback semiconductor laser prominently.

From this point of view, the present inventors have suggested a method of forming falcate quantum wires by first forming stripe patterns in the (1-10) direction on a compound semiconductor substrate of the (100) azimuth by following the procedure reported in Document 2 (Xue-Lun Wang et al., "Fabrication of highly uniform AlGaAs/GaAs quantum wire superlattices by flow rate modulation epitaxy on V-grooved substrates," Journal of Crystal Growth 171 (1997) 341-348), forming V-grooves by wet etching, growing thereon AlGaAs and InAlAs confining in the respective compositions Al, an element sparingly producing surface atomic migration, thereby forming a clad layer retaining the profile of V-shaped grooves, and then supplying GaAs and InGaAs confining Ga and In, elements producing a large surface atomic migration. In this case, when (111)A planes are allowed to be formed as inclined planes to intersect each other, it is made possible to attain growth to a thickness of 1 µm or more in the direction of thickness of growth while the shape of V-grooves mentioned above is retained satisfactorily by setting a proper temperature of crystal growth so as to suit the crystal mixing ratio of the compound semiconductor.

The stationary growth profile is made possible when the growth rate of the (111)A plane having a lower rate of crystal growth against that of the (100) plane having a higher rate of growth is equal to sin $\theta$ relative to the inclination $\theta$ of the crystal plane. Generally, the rate of growth of a specific plane depends on the chemical activity of that plane and the diffusion of the raw material elements from the environment, and the anisotropy due to the azimuth of a crystal plane tends to fade and the rate of growth becomes uniform in accordance as the temperature increases. The rate of growth declines in the azimuth of inactive crystal such as the (111)A plane when the temperature decreases. By adjusting the temperature of the substrate, therefore, it is made possible to form grating profiles at a fixed period.

In this suggestion, however, the period of repetition, namely the pitch of parallel V-grooves, is restricted to the order of microns. This pitch proves unduly coarse as for the purpose of producing a distributed feedback semiconductor laser of fully satisfactory characteristic properties and requires further refinement to the order of submicrons. In the case of submicron gratings having the shortest possible period relative to the distance of diffusion of Ga atoms adhering to the surface of the substrate, however, it is generally considered difficult to attain the necessary growth while a specific profile of crystal growth is retained. In fact, the growth was impossible at first.

Subsequently, the present inventors, as a result of further experiments and studies, managed to succeed in satisfactorily retaining the profile of V-grooves even on the surface of an AlGaAs layer grown on a substrate, though to a certain thickness.

This achievement is reported in Document 3 (C. S. Son, T. G. Kim, X. L. Wang and M. Ogura, "Constant growth of V-groove AlGaAs/GaAs multilayers on submicron gratings for complex optical devices," J. Cryst, Growth, Vol. 221, No. 1/4, pp. 201-207 (December 2000)).

In finding the maximum film thickness of the AlGaAs layer formed on the GaAs substrate gratings while the profile of the gratings is infallibly retained, a trial of alternate superposition of AlGaAs layers about 100 nm in thickness and GaAs layers about 10 nm in thickness will facilitate due judgment. Document 3 mentioned above inserts a report regarding trial alternate superposition of a pair of an AlGaAs layer having a relatively large thickness of about 100 nm and a GaAs layer having a relatively small thickness of about 10 nm on a GaAs substrate having V-grooves formed with a pitch of 0.38 μm on the surface thereof As a result of this experiment, it was found that the profile of the V-grooves of the substrate was satisfactorily retained up to about 1 μm in thickness of superposed layers from the surface of the substrate. A GaAs quantum wire was formed in a falcate cross section and in parallel to the bottom parts of these V-grooves. According to the technique prevalent at the time of disclosure of this publication, however, the profile of V-grooves was seriously impaired when the height of superposed layers reached a level exceeding 1 μm.

Of course, in the actual manufacture such as of a distributed feedback semiconductor laser, though one AlGaAs layer suffices as a clad layer and one or more GaAs quantum wires laid in the vertical direction suffice, it may be safely concluded that the lower V-grooves have a better profile and the quantum wires formed in these V-grooves likewise have a better cross-sectional shape in accordance as the upper V-grooves offer more resistance to the collapse of profile. This fact proves that even on the upper surface of a single AlGaAs clad layer formed in an arbitrary film thickness, gratings are enabled to retain a fully satisfactory profile and implies that the quantum wires to be formed thereon are similarly satisfactory. Even an active layer appearing to be a quantum well layer of the shape of a continuous plane and not quantum wires, namely even an active layer of the shape of a fairly uniform flat plane (the shape of a sheet) having the thickness and width thereof not geometrically modulated or corrugated in conformity with the period of gratings of V-grooves, allows the periodic structure such as of the distribution of refractivity, supposed that gratings of either a guiding or cladding layer underneath are constructed with such high accuracy as expected, and can be similarly utilized very effectively as an active layer in a distributed feedback type semiconductor layer. For the sake of simplicity, the quantum wires will be exclusively described below.

The present inventors have further made studies and experiments with a view to enabling the V-grooves up to a greater thickness of superposed layers to retain a good profile and consequently have succeeded in improving the technique disclosed in Document 3 mentioned above to an extent of suggesting such conditions that even when the clad layer is formed in a thickness at least exceeding 1 μm, preferably approximating closely to or even surpassing 1.5 μm, the V-grooves formed on the surface thereof may retain a fully satisfactory profile. The invention perfected based on this knowledge has been already disclosed in Japan Patent Application No. 2000-404645 (JP-A 2002-204033).

In this patent document, a basic structure is reported to be obtained by etching a plurality of V-grooves extending in the [01-1] direction on a (100) GaAs substrate with a pitch of the order of submicrons in such a manner that the lateral surfaces thereof each constitute a (111)A plane, subjecting the V-grooves to a treatment for removal of a surface oxide layer, thereby enabling the V-grooves to retain an angle of 80 degrees or less even after the treatment, and thermally cleaning them at a temperature in the range of 680° C. to 720° C., thereby forming on the surface of the GaAs substrate a buffer layer of the same material GaAs. These treatments enable the apexes between the adjoining V-grooves which have been dulled by the thermal cleaning to be recovered, allow an AlGaAs layer having an Al percentage of 0.3 to 0.6 or an InAlAs layer having an In percentage of 0.05 to 0.3 to be grown as a clad layer, and further warrant supply of GaAs or InGaAs as well.

Further, the process of growing on the part forming quantum wires or a quantum well layer an AlGaAs guide layer having a smaller Al percentage than the Al percentage of the AlGaAs layer constituting a clad layer or an InAlAs guide layer having a smaller In percentage than the In percentage of the InAlAs layer constituting a clad layer and growing further thereon as an upper side clad layer an AlGaAs layer having an Al percentage of 0.3 to 0.6 or an InAlAs layer having an In percentage of 0.05 to 0.3, is actually favorable for the manufacture of a device utilizing this invention.

By this technique, the V-grooves are enabled to retain a fully satisfactory profile till the height of the laminated structure generously exceeds 1 μm and even reaches 1.5 μm. Of course, the fact that the profile of V-grooves can be retained to such a height proves that the profile of quantum wires in the lower part and the profile inherent in the V-grooves are highly favorable. In fact, when this technique is embodied in quantum wires embedded in an active layer of a distributed feedback semiconductor laser, the quantum wires are found to acquire more than satisfactory characteristic properties. In short, the invention of the aforementioned Japanese Patent Application has established that even when an AlGaAs layer is grown as a single clad layer to a thickness in the range mentioned above by way of an experiment of constructing a laminate structure formed by repeating such multilayer films, the profile of gratings formed on the surface thereof match the substrate gratings and can be retained fully satisfactorily. The quantum wires that are formed thereon acquire fully satisfactory profile and characteristic properties as a matter of course. The AlGaAs clad layer having a thickness falling short of the upper limit of the range can be expected to bring still better results.

As regards the quantum wires, the present inventors' efforts have developed such an environment as allows provision of quantum wires of fairly better performance. The method of production thereof is simple and capable of forming by one time selective growth of high-density multiple quantum wires with highly satisfactory profile and characteristic properties at a necessary position in the structure of a given device. Such an excellent structure of quantum wires as this has not made a true contribution to the industry unless it has achieved a development in terms of application.

This invention has been initiated with a view to developing such applications and, therefore, is aimed at providing a quantum nano-structure semiconductor laser particularly promising a growing demand, which is capable of satisfying at least either or preferably both of the reduction of the threshold value and the stabilization of frequency of oscillation, the factors which are constantly in need of improvement. It is provided, however, that with the same intent, this invention is not limited to the quantum nano-structure semiconductor laser but has as its intrinsic object the provision of a quantum nano-structure array which, uses periodically disposed limited-length quantum wires or quantum dots and which can be developed into various optically functioning devices.

DISCLOSURE OF THE INVENTION

For the purpose of accomplishing the object mentioned above, the first aspect of this invention is directed toward providing a quantum nano-structure semiconductor laser comprising a grooved semiconductor substrate furnished with a plurality of V-grooves individually extended in directions perpendicular to a direction of a laser beam and mutually disposed in parallel along the direction of the laser beam and a plurality of quantum wires formed one on each of the V-grooves by selective growth of a Group III-V compound, the plurality of quantum wires being mutually disposed in parallel along the direction of advance of the laser beam with a period of an integer times of a quarter wavelength in a medium of a laser active layer and disposed individually as an active layer region of a limited length corresponding to a width of stripes of laser. Thus, this invention is capable of providing a quantum nano-structure semiconductor laser that satisfies at least one, or preferably both, of the reduction of the threshold and the stabilization of the frequency of oscillation more satisfactorily than the conventional countertype.

It is provided, however, that the waveguide mode may be stabilized by intentionally varying the period of parallel disposition of the quantum wire array from the period of an integer times of a quarter wavelength mentioned above instead of disposing the quantum wires in parallel along the direction of advance of a laser beam with a period of an integer times of a quarter wavelength in the medium of the laser active layer. In this way, the oscillation of a broadband wavelength or the oscillation of short pulses in the state of mode lock may be attained by promoting compensation of the dispersion between the oscillation modes.

A structure commendable from the viewpoint of material can be provided by this invention. Examples are a semiconductor laser which is provided with V-grooves of a limited length formed in the [01-1] direction on a GaAs (100) or (311)A substrate, quantum wires of a limited length grown on the V-grooves of the limited length and made of GaAs or InGaAs and a clad region of GaAs or AlGaAs so disposed as to cover the quantum wires; and a semiconductor laser which is provided with V-grooves of a limited length formed in the [01-1] direction on an InP (100) or (311)A substrate, quantum wires of a limited length grown on the V-grooves of the limited length and made of InGaAs and a clad region of InAlAs so formed as to cover the quantum wires. These semiconductor lasers may be used as a gain-coupled or refractive index-coupled distributed feedback laser.

This invention also provides a structure which has adjoining quantum wires mutually connected in a flat part between the adjacent V-grooves or on an upwardly curved convex part of each of the V-grooves so as to assume eventually the shape of a plane (though slightly corrugated) instead of using mutually independent quantum wires. Also in this case, the material described above by way of example can be adopted.

Further, this invention provides a quantum nano-structure semiconductor laser wherein a laser active layer of a prescribed width which is an effective laser oscillating part formed by selective growth of a Group III-V compound on a semiconductor substrate is in the shape of a flat sheet devoid of corrugation and the periodic perturbation is provided at both sides of the laser active layer in the direction perpendicular to the laser beam from V-grooves individually extended in the directions perpendicular to the laser beam and mutually disposed in parallel along the direction of the laser beam with a period of an integer times of the quarter wavelength in the medium of the laser active layer.

As another embodiment, this invention provides a quantum nano-structure semiconductor laser which is provided with a grooved Group III-V compound semiconductor substrate furnished with a plurality of V-grooves individually extended in the directions perpendicular to the direction of the laser beam and mutually disposed in parallel along the direction of the laser beam with a period of an integer times of the quarter wavelength in the medium of the laser active layer, a plurality of InGaAs or InAs quantum dots formed in each valley part of the V-grooves by growing InGaAs or InAs to a thickness exceeding the critical film thickness on the V-grooves, and the plurality of quantum dots serving as laser active regions, and the GaAs or AlGaAs layers covering the regions serving as clad regions.

Even when the V-groove structure and the quantum dots mentioned above are used, the waveguide mode may be stabilized by intentionally displacing the plurality of V-grooves from the period of an integer times of the quarter wavelength instead of disposing them with a period of an integer times of the quarter wavelength instead of disposing them with a period of an integer times of the quarter wavelength in the medium of the laser active layer, or the oscillation at a broad band wavelength or the short pulse oscillation in the mode lock operation may be attained by promoting compensation of the dispersion between the oscillation modes.

Of course, similarly again, this invention contemplates providing such substrate materials as are favorable for the application of quantum dots. It is commendable to adopt a GaAs (100) or (311)A substrate or an InP (100) or (311)A substrate as the grooved Group III-V compound substrate.

Further, a distributed feedback semiconductor laser obtained by mesa-etching the lateral surfaces of the structure including quantum dots may be suggested and a semiconductor laser obtained by imparting corrugation to the lateral surfaces of the structure including quantum dots which are parallel to the propagation direction of light, thereby transforming the structure to a distributed feedback type, may be suggested.

This invention further proposes a semiconductor laser which is obtained by perforating a structure including quantum dots with a plurality of through holes spaced with a certain period along the lateral sides of the structure and also at both end of the structure spaced perpendicular to the propagation direction of light in such a manner as to leave behind the stripe parts for passing the laser beam. Here, the period of spacing the holes is typically set at a half of the wavelength in the medium.

This invention can provide not only the quantum nano-structure semiconductor laser described above but also a quantum nano-structure array that is adaptable to a wide variety of optical functional devices. For example, there can be provided a quantum nano-structure array which is provided with a grooved semiconductor substrate furnished with a plurality of V-grooves individually extended in the directions perpendicular to the propagation direction of light and mutually disposed in parallel along the propagation direction of light, and with a plurality of quantum wires formed on the V-grooves by the selective growth of a Group III-V compound being mutually disposed along the light direction with a period of an integer times of the quarter wavelength in the medium of the waveguide layer for passing the light and individually adapted to serve as waveguide regions of a limited width corresponding to the width of the waveguide. Here again, the waveguide mode may be stabilized or the compensation of dispersion concerning the light passing the waveguide may be effected by intentionally displacing the plurality of quantum wires from the period of an integer times of the quarter wavelength mentioned above instead of disposing them along the direction of light propagation with a period of an integer times of the quarter wavelength in the medium of the waveguide layer.

By the same token, this invention can provide a quantum dot array which is provided with a grooved semiconductor substrate furnished with a plurality of V-grooves individually extended in the directions perpendicular to the light propagation and mutually disposed in parallel along the light propagation with a period of an integer times of the quarter wavelength in the medium of the waveguide layer, the grooved semiconductor substrate having a plurality of InGaAs or InAs quantum dots formed in the valley parts of the V-grooves by growing InGaAs or InAs to a thickness exceeding the critical film thickness on the V-grooves, and the plurality of quantum dots serving as laser active regions, and the GaAs or AlGaAs layers covering the regions serving as clad regions. Again, similarly to the preceding case, the waveguide mode may be stabilized or the compensation of dispersion may be effected by intentionally displacing the plurality of quantum dots from the period of an integer times of the quarter wavelength instead of disposing them with a period of an integer times of the quarter wavelength in the medium of the waveguide layer.

This invention can provide a structure that is convenient for the construction of a various kinds of optical integrated circuits. For example, an array structure which is obtained by disposing a plurality of quantum nano-structure semiconductor lasers contemplated by this invention as described above on one and the same substrate and connecting them with a ridge type waveguide may be used not only as a semiconductor laser array but also as an integrated multi-wavelength light source, with the conditions of component parts or a ridge type waveguide structure or relevant parameters duly varied.

BRIEF DESCRIPTION OF THE DRAWINGS

FIG. 1(A) is a schematic diagram of a semiconductor laser as the first preferred embodiment of this invention.

FIG. 1(B) is a schematic diagram of a modified example of the semiconductor laser of this invention shown in FIG. 1(A).

BEST MODE FOR CARRYING OUT THE INVENTION

Figure 2A:
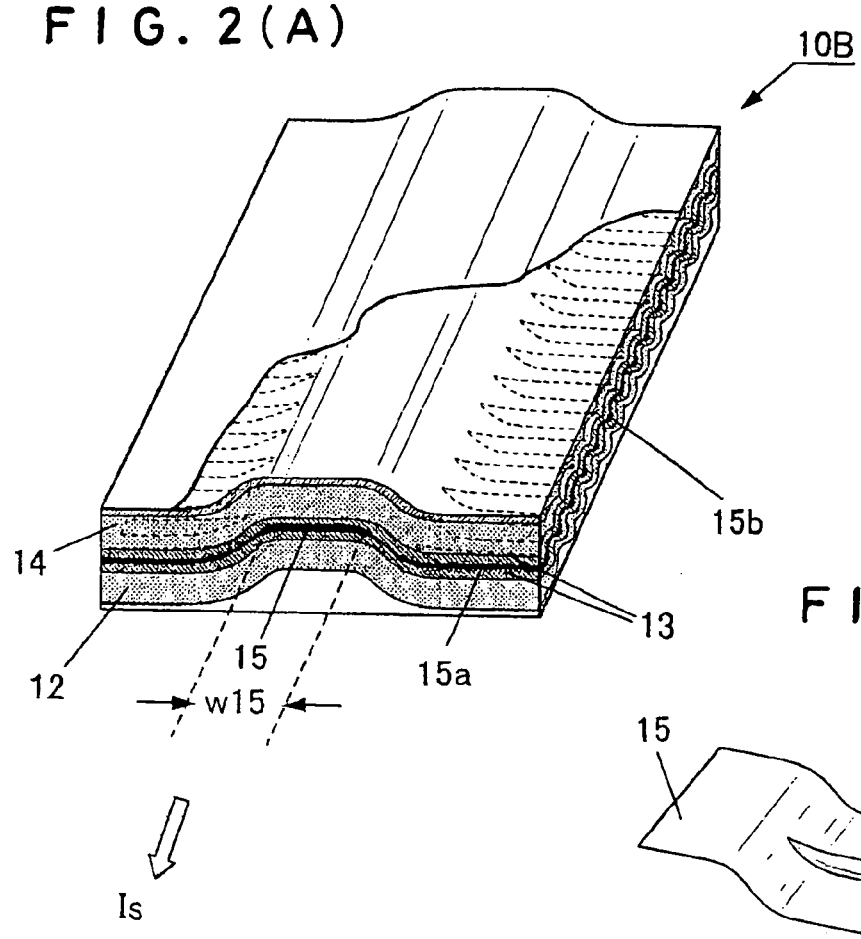
FIG. 2(A) is a schematic diagram of another modified example of the semiconductor laser of this invention shown in FIG. 1(A).

This invention will be described more specifically below with reference to the drawing annexed hereto.

In FIG. 1, one example of the structure of a distributed feedback semiconductor laser 10 as one preferred embodiment of a quantum nano-structure semiconductor laser constructed in accordance with this invention. Basically, the whole structure is manufactured by the method of production disclosed in Japan Patent Application No. 2000-404645 (JP-A 2002-204033). It is provided with an active layer which, as viewed in the direction of light emission Is, comprises a V-groove substrate having a plurality of V-grooves disposed in parallel thereon and limited-length GaAs or InGaAs quantum wires 11 individually formed in V-groove regions of the V-groove substrate and typically measuring 5 to 20 nm in thickness and 10 to 50 nm in the size in the direction of laser beam emission Is and 0.5 to 2 µm in the size (width) of the direction perpendicular to the direction of laser beam emission Is. The pitch of parallel disposition of the plurality of limited-length quantum wires 11 along the direction of laser beam emission Is is set at $n\lambda/4$ (wherein n denotes an integer) which is an integer times ¼ of the wavelength λ in the medium such as, for example, a period of ¼ or ¾ wavelength in the medium (0.15 to 0.5 µm).

The perimeter of this array of quantum wires is covered with an upper and lower guide layer 13 about 0.2 µm in a vertical size, a lower AlGaAs clad layer 12 about 1 µm in thickness and an upper clad layer 14. One of the upper and lower clad layers 14 and 12 is of an N type and the other layer is of a P type. The cross section of these quantum wires 11, as described in Japan Patent Application No. 2000-404645, generally has a falcate shape. The clad layers 12 and 14 maybe formed of GaAs.

To cite a slightly more concrete example of the procedure of production, a group of V-grooves of a limited length is repeatedly formed in the (1-10) direction on a (100) substrate with a period of an integer times ¼ of the quarter wavelength in the medium, an N type AlGaAs lower clad layer 12 having an Al percentage of about 0.4 and a non-doped AlGaAs guide layer 13 having an Al percentage of about 0.2, for example, are sequentially formed thereon, further InGaAs quantum wires 11 having an In percentage of about 0.1 is formed, and subsequently a non-dope AlGaAs guide layer 13 having an Al percentage of about 0.2 (since this guide layer, when formed, transforms into an integral member covering the quantum wires 11, the upper and lower guide layers are jointly denoted by a reference numeral 13 in the diagram) and a P type AlGaAs upper clad layer 14 having an Al percentage of about 0.4 are continuously grown.

In this structure contemplated by this invention, the laser oscillation is accomplished with a lower threshold than ever because the periodically arrayed quantum wires 11 are closed at both ends thereof and consequently are given a limited length and the diffusion of minority carriers is suppressed in the lateral direction along the quantum wire. In fact, this achievement has been demonstrated by the present inventors' experiment.

Incidentally, the existing manufacturing technique has set examples of forming V-grooves in the [01-1] direction by using not only a GaAs (100) substrate but also a GaAs (311)A substrate. The GaAs or InGaAs quantum wires 11, therefore, can be formed on these substrates and the InGaAs quantum wires 11 of a limited length can be formed in the [01-1] direction by using an InP(100) or (311)A substrate. To the structures thus obtained, the present invention can be applied. Particularly, when the InP substrate is used, the lower clad layer on the V-groove substrate is allowed to have a decreased thickness and the retention of a periodic structure of V-groove array of a short period is facilitated because the InP substrate is transparent to the oscillation wavelength.

Now, the other embodiments of this invention will be explained below with reference to the diagrams of FIG. 1(B) onward. In all the diagrams including and following FIG. 1(B), the reference numerals identical to those used in FIG. 1(A) are meant to represent the identical or similar structural elements. The repeated explanation of these elements will be omitted.

First, as briefly stated above, a structure, such as the semiconductor laser 10A of this invention illustrated in FIG. 1(B), is conceivable even though the quantum wires 11 are not formed mutually in a perfectly independent form and individually in a geometric form on the V-groove grating. Specifically, even an active layer which appears to be a quantum well layer in the form of a continuous plane, as observed when the opposite sides in the direction of light emission of the parts 11 corresponding to the quantum wires in FIG. 1(A) are connected to the parts 11 of the adjacent quantum wires through a thin active layer part 11a, is enabled to manifest the same function and effect as the semiconductor laser 10 illustrated in FIG. 1(A) so long as the thickness of an active layer 15 is modulated, as illustrated in FIG. 1(B), in conformity with the period of V-groove grating, namely the period of $n\lambda/4$ (wherein n denotes an integer), such as ¼ or ¾, which is an integer times of the quarter wavelength $\lambda$ in the medium. This point has been demonstrated by the present inventors' experiment. As depicted in the diagram, the parts 11 corresponding to the quantum wires are relatively thick and the mountainous parts 11a between the V-groves are thin. The structure of this nature proves particularly effective when the shapes of V-grooves in the lower clad layer 12 or the guide layer 13 on the lower side are liable to dull. Notwithstanding this fact, even a continuous active layer structure may well be regarded as a structure of parallel disposed quantum wires so long as the region which predominantly exerts an effective carrier confining action concerning the laser oscillation constitutes a relatively thick active layer part 11 exclusively.

Further, the same function can be obtained and the oscillation with a low threshold can be achieved even when the width of the waveguide perpendicular to the direction Is of light emission are modulated along the direction Is of light emission in conformity with the period of V-groove grating.

Figure 2B:
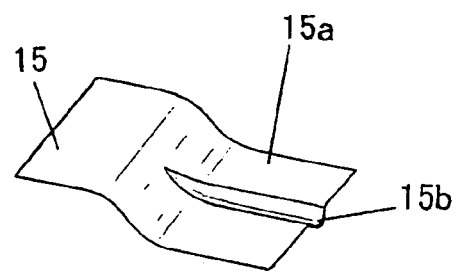
FIG. 2(B) is an explanatory diagram schematically illustrating one portion of the active layer part of the semiconductor laser shown in FIG. 2(A).

It has been found that the active layer itself does not need to be geometrically modified when the width of the waveguide mentioned above are modulated along the direction Is of light emission. This observation will be explained with reference to FIGS. 2(A) and 2(B). A semiconductor laser 10B of this invention illustrated in FIG. 2(A) is such that the part of the active layer 15 serving as an effective oscillating part and having a predetermined width w15 does not jog and constitutes an active layer 15 of the form of a uniform flat plane (sheetlike form). The opposite sides thereof however, form the parts of mountain bases like the bases of a mesa and are furnished with structures each having V-grooves disposed in parallel along the direction Is of light emission with a period of $n\lambda/4$, such as ¼ or ¾, which is an integer times of the quarter wavelength $\lambda$ in the medium, namely V-groove gratings. As illustrated in FIG. 2(B) which depicts the active layer 15 and the opposite side part 15a thereof exclusively, the opposite mountain base parts 15a continuing to the active layer 15 having the width w15 mentioned above are so shaped as to give rise to grooves 15b corresponding to the V-grooves, while the effective part of the active layer 15 which contributes to the laser oscillation is flat. It has been found that a periodic structure, such as of distribution of refractivity in the quantum well layer mentioned above, can be constructed with high accuracy as expected and a low-threshold distributed feedback type semiconductor layer can be likewise obtained even when the edge parts of such an active layer are each provided with a structure of geometrically modulated V-grooves.

Figure 3:
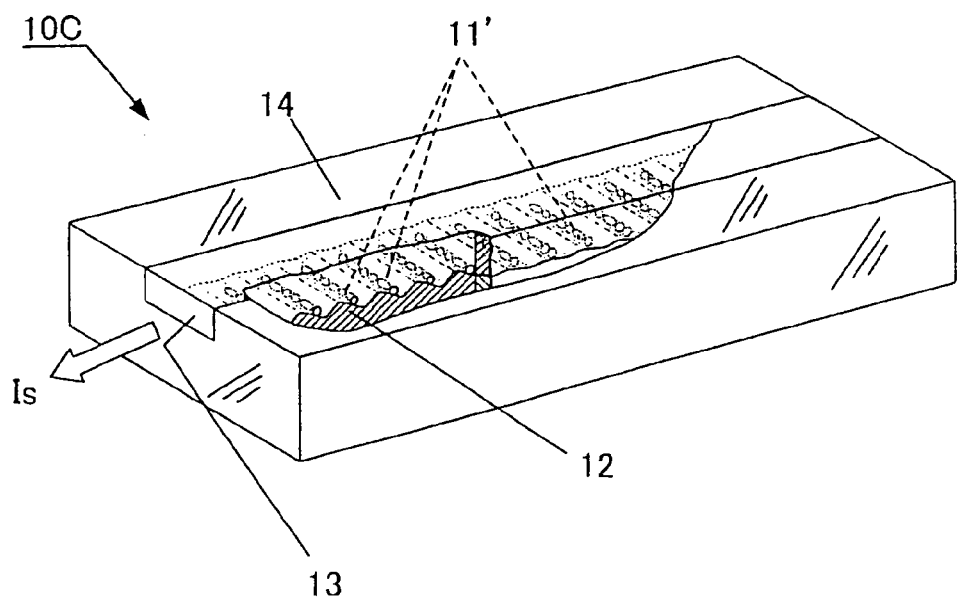
FIG. 3 is a schematic diagram of yet another modified example of the semiconductor laser of this invention shown in FIG. 1(A).

This invention can utilize quantum dots as well. Also in the semiconductor laser 10 illustrated in FIG. 1(A), the quantum wires 11 depicted as assuming a falcate cross section, depending on the conditions of manufacture, may optionally be caused to form a plurality of quantum dots within each of the V-grooves as though they were finely split. Naturally, even in this case, the same effect can be expected. An artist's concept of this situation is depicted in FIG. 3. The quantum wires 11 which are depicted as a physical region continued in the direction of width in the semiconductor laser 10 illustrated in FIG. 1(A) assume a form as though split in the direction of width mentioned above in a semiconductor laser 10C illustrated in FIG. 3 and constitute an aggregate of quantum dots 11' in the individual grooves. Even in this structure, the same function and effect can be manifested as the semiconductor laser of this invention illustrated in FIG. 1(A).

Figure 4A:
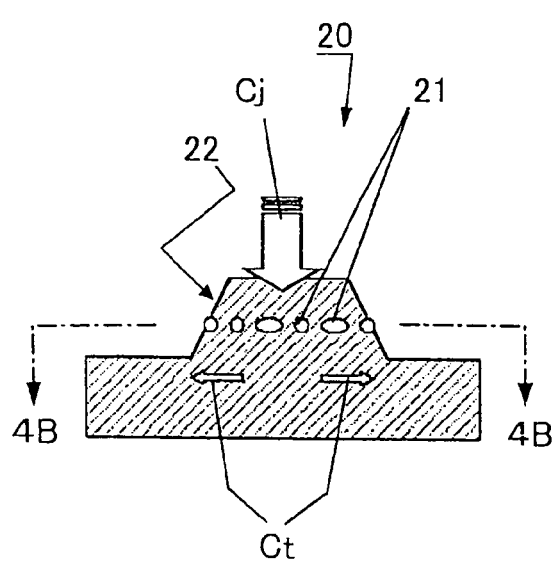
FIG. 4(A) is a schematic diagram taken in a cross section of a semiconductor laser as another preferred embodiment of this invention.
Figure 4B:
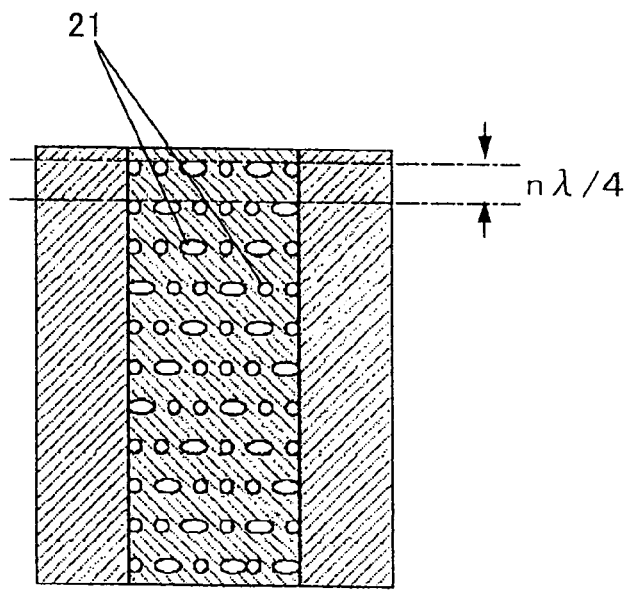
FIG. 4(B) is a schematic diagram in a cross section taken through FIG. 4(A) along line 4B-4B.

FIG. 4 illustrates a quantum nano-structure semiconductor laser 20 according to another embodiment of this invention. This laser also uses quantum dots 21. When InGaAs is grown on such a V-groove substrate as described already, with the increased In percent and the thickness of grown film and with a low growth speed, InGaAs or InAs multiple quantum dots 21 can be formed selectively on the V-grooves. The intervals between the parallel disposed V-grooves, namely the intervals of parallel disposition along the direction of advance of light between the groups of quantum dots 21 arranged in a line, are set similarly to the case of using the quantum wires described above at $n\lambda/4$, i.e. an integer times a quarter wavelength in the medium of the laser active layer. It is provided, however, that the shapes of the individual quantum dots 21 are not infrequently dispersed as schematically illustrated in the diagram. And this fact possibly functions rather significantly as described herein below.

Nevertheless, as is so in the case of the quantum wires 11 described above, the V-grooves of a limited length do not always retain the shape of grooves incised in the substrate owing to the selective growth. They are allowed to use the shape which results from growing a lower clad layer, forming a guide layer or the like, then withdrawing the substrate once from a growing furnace, incising V-grooves of a limited length thereon, and performing the second growth up to a plurality of repetitions as carried out in the conventional process, such as quantum wires and quantum dots, subsequently forming an upper guide layer and an upper clad layer. An attempt to retain the shape after the growth has been made to a large thickness results in necessitating an enlargement to the period of grating. In the case of a grating using a period of not more than 0.2 μm, the shape is preserved and grown only with difficulty. Such functions as allowing insertion of an active layer exclusively in the anti-node of light are effectively manifested and the adherence to the excellence of the V-groove shape of a substrate may be possibly dispensed with as occasion demands when the quantum wires having the length thereof limited by the opposite closed terminals bring an effect of inhibiting dissipation of carriers and the quantum dots are formed exclusively at required places according to this invention.

These quantum dots 21 assume a structure such that the entire perimeter of an active layer is encircled with a clad layer of large bandgap energy. Thus, they are equivalent in that buried heterostructures are realized automatically Consequently, the dissipation of injected carriers can be prevented because the electron-hole pairs based on the injection of electric current are retained within quantum dots as schematically shown with a thick arrow mark Ct in FIG. 4 and the diffusion length of minority carriers in the lateral direction along the direction of width schematically indicated with fine arrow marks Ct becomes small. A discussion regarding this effect of confinement itself can be found in Document 4: J. K. Kim, T. A. Strand, R. L. Naone, and L. A. Coldren, "Design Parameters for Lateral Carrier Confinement in Quantum Dot Lasers," Appl. Phys. Letters, 74 (19) (May 10, 1999) 2752-2754. When this effect is utilized, therefore, a distributed feedback type quantum dot laser having a low threshold and enjoying a stabilized oscillation frequency can be realized by a simple method of production which merely comprises mesa-etching the stripe part of the structure having groups of quantum dots formed thereon, thereby transforming the structure into a mesa structure 22 and obviates the necessity for an embedded structure.

The material does not need to be particularly restricted, but is only required to allow realization of a structure contemplated by this invention. The InGaAs or InAs quantum dots that are formed by growing InGaAs or InAs to a thickness exceeding the critical film thickness on V-grooves are realistic. Commendably, the V-groove substrate is a GaAs (100) or (311)A substrate, or an InP (100) or (311)A substrate. This point is held good with the other embodiments of this invention.

Figure 5:
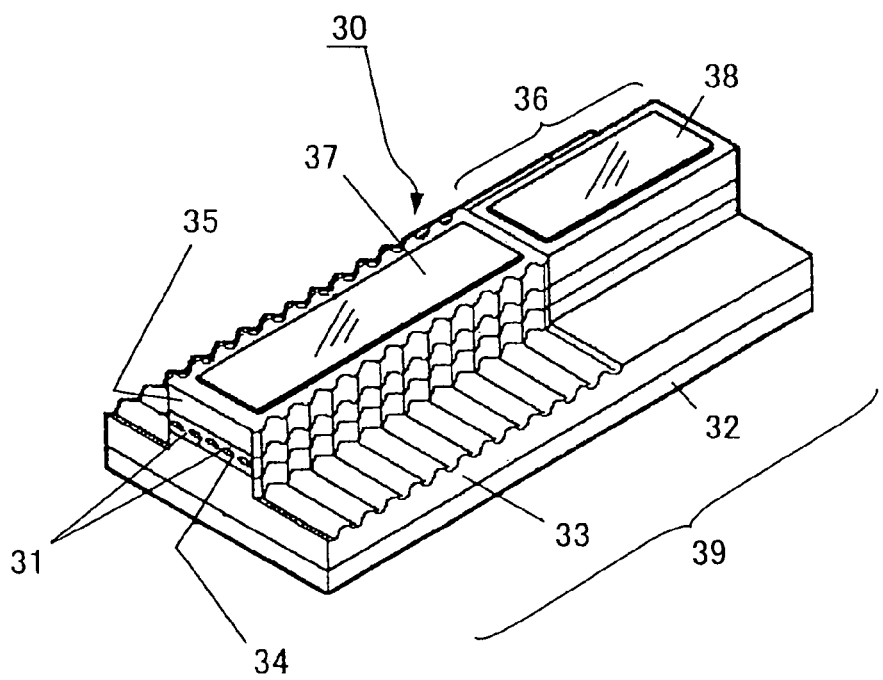
FIG. 5 is a schematic diagram of a semiconductor laser as still another preferred embodiment of this invention.

FIG. 5 illustrates another preferred embodiment 30 of the semiconductor laser of this invention. According to the reports published to date, a quantum dot laser having quantum dots embedded in an in-plane pattern has been materialized by adopting a technique of crystal growth of the so-called SK mode (refer, for example, to Document 5: Z. Zou, D. L. Huffaker, S. Csutak, and D. G. Deppe, "Ground state lasing from a quantum-dot oxide-confined vertical-cavity surface-emitting laser," Appl. Phys. Letters 75 (1), Jul. 5, 1999, p. 22).

A study is now underway regarding the manufacture of a DFB laser by the application of a metallic irregular surface grating or a selective ion implantation with a focus ion beam to the lateral surfaces of a waveguide from the surface with the omission of an embedding re-growth process (refer, for example, to Document 6: H. Konig, S. Rennon, J. P. Reithmaier, and A. Forchel, "1.55 μm single mode lasers with complex coupled distributed feedback gratings fabricated by focused ion beam implantation," Appl. Phys. Letters 75 (11), September 1999, p. 1491).

When a quantum well is used as an active layer, however, it is necessary that the etch depth to define the ridge waveguide should be shallow above the active layer for the purpose of avoiding carrier surface recombination on the processing interface. This shallow processing layer entails the problem of preventing acquisition of a fully satisfactory stabilization of wavelength.

According to this invention, however, it is made possible to suppress the minority carrier diffusion velocity by forming a lower clad layer on a V-groove substrate satisfying the conditions defined by this invention, an active layer in a guide layer to confine therein groups of quantum dots disposed with a prescribed period of an integer times of the quarter wavelength in the medium, and forming an upper clad layer as explained above with reference to FIG. 3 Besides, as another structure, this invention allows construction of a DFB type optical resonator even when the quantum dots themselves have random positions by forming a lower clad layer 33 on a V-groove substrate 32, providing an active layer in an upper-lower guide layer 34 with groups of quantum dots 31, thereby forming an upper clad layer 35, and boring the side of a structure confining the quantum dots 31 along the direction of advance of light deep enough to permeate the quantum dots, thereby forming periodic lateral surfaces as exemplified by a quantum nano-structure semiconductor laser 30 illustrated in FIG. 5. That is, this invention allows realization of a DFB laser having a low threshold and enjoying a fully satisfactorily stabilized wavelength without requiring a re-growth process.

With reference to FIG. 5, one optical integrated circuit (OEIC) 39 is constructed by integrally forming the part of the semiconductor laser 30 nearly corresponding to the region having formed therein an electrode 37 for a laser, serially with a modulator part 36 corresponding to the region having an electrode 38 for a modulator formed therein. The structure of this modulator part 36 per se is not particularly restricted by this invention, but may be a proper known structure selected arbitrarily.

Figure 6:
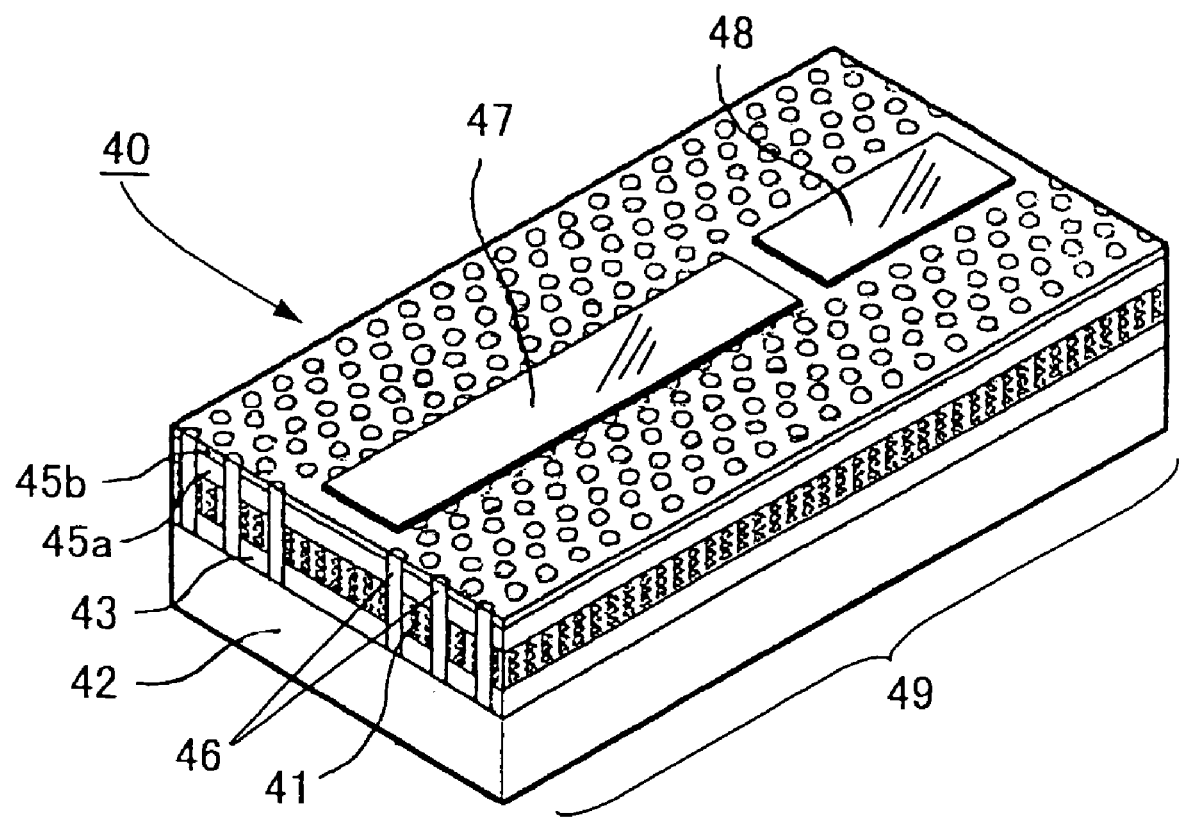
FIG. 6 is a schematic diagram of a semiconductor laser as a further preferred embodiment of this invention.

As mentioned above, since the advent of the so-called "Fiber to the Home" age, the need of freely controlling the optical signals on an optical fiber network has been urging attention and the necessity for manufacturing semiconductor laser arrays of different frequencies with the object of freely switching and exchanging the lights emitted by these arrays has been finding growing recognition. FIG. 6 is a schematic view of an optical integrated circuit 49 using a two-dimensional photonics crystal and constructed in accordance with this invention. This circuit 49 is constructed by forming a lower clad layer 43 on a semiconductor substrate 42, disposing thereon in accordance with this invention as interposed between upper and lower guide layers a multiplicity of groups of quantum dots with a prescribed period, namely a period of an integer times the quarter wavelength in the medium preferably as further superposed in a plurality of layers in the direction of height, forming an upper clad layer 45a and a surface layer 45b, and forming an electrode 47 for a laser in a laser region part 40.

The embodiment illustrated in FIG. 6 is characterized by having holes 46 bored through a structure having superposed quantum dot layers formed therein along the lateral sides thereof so as to leave behind stripe parts for passing a laser beam in the direction of advance of light and in the vertical direction perpendicular to the lateral direction perpendicular to the direction of advance of light with a prescribed period. The period is set, for example, at ½ of the wavelength in the medium.

Consequently, the stripe parts enclosed with the lines of the holes extending along the direction of advance of light constitute waveguides. By designing the intervals of these holes, therefore, it is made possible to allow the waveguide wavelength selectivity and enable a signal to be guided through specific waveguides.

That is, the OEIC 49 necessary for an optical transmission system can be realized by having lasers, modulators, branches, filters, etc. connected onto one and the same substrate through the two-dimensional photonics optical waveguides. In the illustrated case, the modulators provided with the electrodes 48 for modulation are integrated.

As observed in this embodiment, the fact that an active optical module can be realized only by the disposition of holes and electrodes is highly valuable even practically.

When the quantum dots are used, since the surface recombination poses no big problem, a two-dimensional optical circuit can be formed by an additional fabrication. Incidentally, the holes 41 may be empty holes filled with air and these empty holes may be optionally filled with a medium of proper refractivity. They are only required to serve as empty holes from the viewpoint of an optical circuit.

Figure 7:
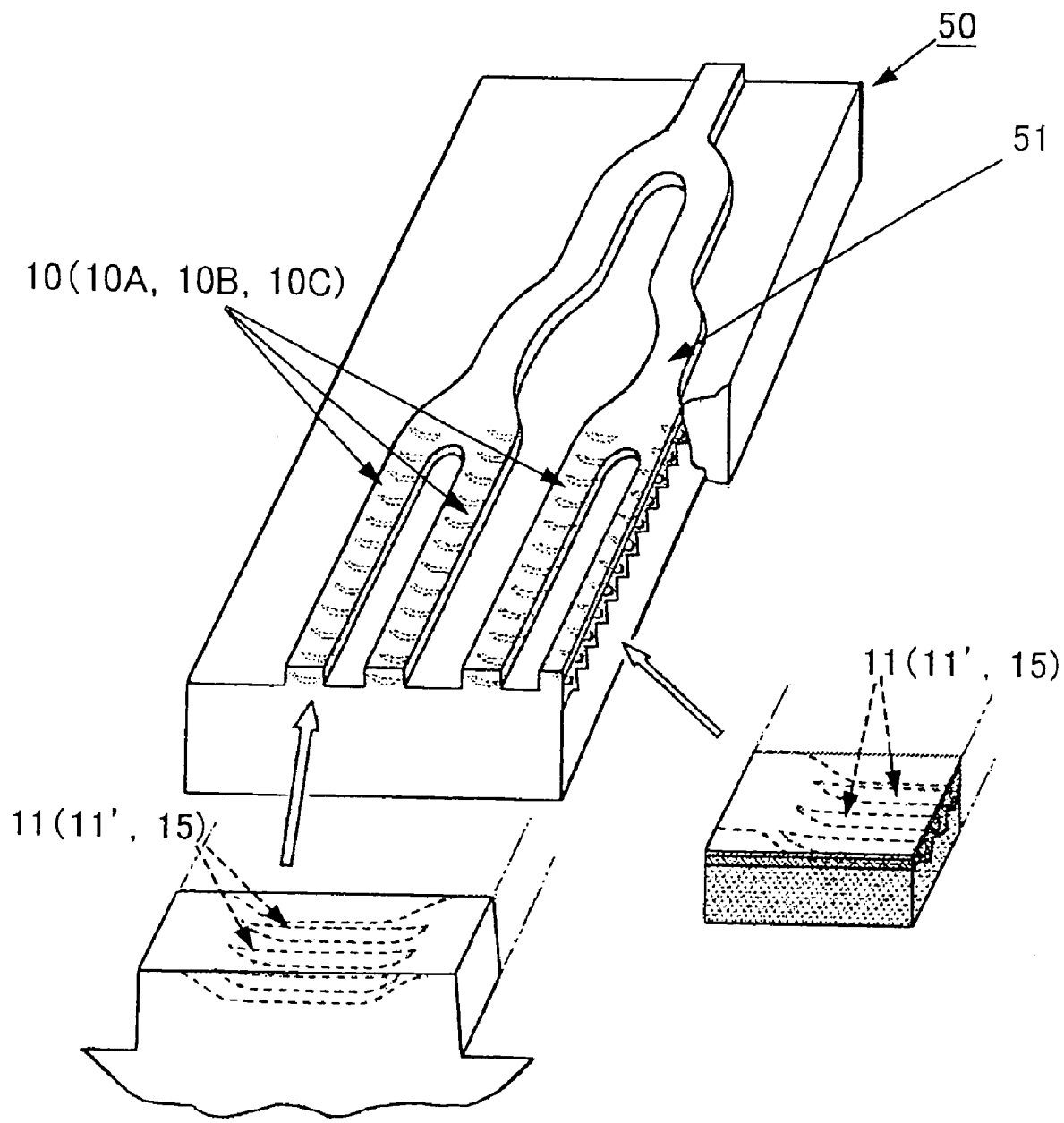
FIG. 7 is a schematic diagram of a preferred embodiment of this invention in constructing a quantum nano-structure semiconductor laser array or multi-wavelength light source.

FIG. 7 depicts a monolithic OEIC 50 that makes use of this invention. It has on a proper substrate a ridge type optical waveguide 51 which may be constructed by any of the known techniques. This waveguide 51 has formed therein branch lines that severally serve properly as optical waveguides. These branch lines are each required to have a semiconductor laser of this invention constructed in advance therein as already explained above with reference to FIGS. 1 to 3. It is schematically depicted, with a portion magnified for the sake of explanation. The quantum wires 11 already explained and the quantum dots 11', the active layer 15 and the like described above are disposed in the semiconductor laser region 10 (or 10A, 10B, 10C). Thus, the OEIC 50 constitutes a semiconductor laser array. Otherwise, by varying the conditions of periods concerning the relevant dispositions relative to the wavelength in the medium and by varying the construction and parameter of the ridge type waveguide, it can be utilized as an integrated multi-wavelength light source. Actually, the ridge type optical waveguide may be formed after semiconductor laser parts are formed at proper locations preliminarily in the V-groove grating structure under the conditions in conformity to this invention. This invention produces the ease and the convenience with which such structures are formed un V-grooves by one cycle of selective growth.

Of course, it is possible to provide each of these waveguides with the structure of an active layer region that is used in the semiconductor laser of this invention as already described with reference to FIGS. 3 to 6.

This invention is enabled by taking into due consideration the same dispositional relation as in the quantum nano-structure semiconductor laser which has been described hitherto concerning the disposition of limited-length quantum wires or quantum dots to provide not only semiconductor lasers but also quantum nano-structure arrays which are applicable to various "optically functional elements." In other words, it promises useful applications when this invention is defined as a limited-length quantum wire array or a quantum dot array confined in the waveguide region for passing light within the width thereof and parallel disposed in the direction of advance of light with a period of an integer times of the quarter wavelength in the medium of the waveguide. The materials and the procedure to be adopted for the manufacture of this array may be the same as those described hitherto regarding the quantum nano-structure semiconductor laser of this invention.

By the quantum nano-structure array contemplated by this invention, namely by the structure having limited-length quantum wires or quantum dots disposed with a period conforming to this invention, since the density of states is rendered discrete and the width of gain band is narrowed in the semiconductor laser, the injected carriers are efficiently concentrated on a quantum level conforming to a specific wavelength of oscillation. And this concentration results in decreasing the threshold. When it is applied directly to the active layer of a modulator as one of the optically functioning elements, for example, sharp state density means that the gain is peaked at a sharp wavelength characteristic of the Lorentz type and results in suppressing the change of the peak position thereof The wavelength dependence of refractivity corresponds to the differential waveform. As a result, the refractivity is nullified in the neighborhood of the center of the gain being oscillated and stable against the variation of carrier concentration. Generally, change of refractivity against the carrier density is called an "alpha parameter." The active layer formed of the limited-length quantum wire array or quantum dot array disposed in conformity with this invention is capable of appreciably decreasing the alpha parameter and, therefore, is enabled to effect high-speed modulation.

Even when external modulation is resorted to the use of the quantum nano-structure array conforming to this invention results in decreasing the time delay of the individual wavelengths due to the variation of bias in accordance with the steep absorption characteristics. Thus, by harnessing the difference of slope on the opposite sides of the absorption characteristics, it is made possible to efficiently execute the manipulation of wavelength dispersion, such as of delivering the short wavelength component having a slow speed of transmission ahead of other components.

The application of the quantum nano-structure array of this invention to the active layer of an optical amplifier, as clearly inferred from former embodiment described with reference to the schematic view of FIG. 4, can be actually expected to widen the range of the presence of gains (about 100 nm, for example) due to the inherent size fluctuation of quantum dots. Thus, it becomes feasible to amplify channels spread over a wide zone collectively.

The mode lock laser and the Mach-Zender type optical switch utilize a supersaturated absorber and the speeds of response of these devices just match the frequency zone necessary for the optical transmission. To be specific, the optical transmission utilizes the pulse transmission in an approximate frequency range of 10 GHz to 100 GHz, which corresponds to the time domain of 10 ps to 100 ps. Thus, such a relaxation phenomenon as enables restoration to the former state within several ps proves advisable. In the case of quantum dots, the relevant pulse width just reaches the range of picoseconds because the capture of multiple carriers in the dot level, is slower than the quantum well. If the capture is unduly fast, the number of photons necessary for saturation will be wasted. If it is unduly slow, the restoration to the initial state will not be finished till the next pulse arrives. The speed just falls within the proper range of several pico-second for optical communication. Thus, the adoption of a limited-length quantum wire array or quantum dot array constructed by the disposition of this invention enables this control to be effectively executed.

The quantum nano-structure array constructed by this invention can be effectively applied as a frequency modulator/converter. When the three-dimensional nonlinear effect is used and a pump light and a signal light are injected, the frequency conversion is effected at the angular frequency $\omega_c$ following the formula; $\omega_c = \omega(\text{pump light}) \times 2 - \omega(\text{signal light})$. Since this effect is produced by the coherent interaction of the light and the quantum state in the quantum nano-structure, it occurs more strongly when the quantum state is not perturbed from the exterior and the phase state is retained than otherwise. The phase relaxing time is called "gamma (γ)." The quantum dots having an isolated quantum state have a longer phase relaxing time and, therefore, manifest the nonlinear effect strongly. Since this invention provides a quantum nano-structure array which has the limited-length quantum wires or quantum dots arranged periodically, it enables the wires or dots to concur on the anti-node of light, causes the aforementioned effect to manifest strongly in a small volume of the active layer, delays the group velocity of light (in other words, reciprocation of light in the material) and allows the gain and absorption of light to occur efficiently.

In short, the quantum nano-structure array of this invention can serve as an effective device also in constructing various optically functioning elements mentioned above.

In all the embodiments described hitherto, the quantum nano-structure semiconductor lasers and the quantum nano-structure arrays alike which conform to this invention have been delineated as having limited-length quantum wires parallelly disposed, quantum dots formed therein and V-grooves forming an active layer thereon parallel disposed invariably with a period of an integer times of the quarter wavelength in the medium. By intentionally displacing them from the period of an integer times of the quarter wavelength in the medium of the laser active layer or the waveguide layer, it is made possible to stabilize the waveguide mode. Then, by promoting the dispersion compensation among the oscillation modes within the active region in the case of a semiconductor laser or by applying the dispersion compensation against the passing light in the case of an externally disposed mirror or waveguide, it is made possible to attain broadband wavelength oscillation or short pulse oscillation in the mode lock mechanism.

Regarding the latter compensation of dispersion, a commendable technique for optimizing this compensation has been already disclosed in JP-A 2000-352614. When the construction contemplated by this invention is relied on to promote the compensation of dispersion, therefore, the invention already disclosed as described above may be consulted in deciding the degree of the displacement mentioned above. To cite one sheer example, since the dispersion of wavelengths (difference in speed of light propagation due to difference in wavelength) can be varied for individual wavelengths depending on the degree of the displacement of the period of quantum wires or V-grooves from ¼ of the wavelength in the medium, it is made possible by causing numerous longitudinal modes to be propagated invariably at the same speed to induce formation of a state in which numerous wavelengths are synchronized in the same phase (mode lock) or to induce efficient generation of a light pulse of an extremely short (2-30 fs) width.

INDUSTRIAL APPLICABILITY

According to this invention, there can be provided a semiconductor laser excelling in the property of stabilizing the oscillation frequency with a low threshold preferably by one cycle of selective growth as described above. Since the invention enables limited-length high-density multiple quantum wires and quantum dots to be formed at any necessary positions in the structure of a device, a quantum nano-structure array which promises significant application to highly sophisticated quantum nano-structure semiconductor lasers and various optically functioning elements can be realized by a simple manufacturing process.

Further, the communication wavelength zone tends to be enlarged in the future and the wavelength zone of 1.0-1.6 μm has been gaining in importance. The use of the quantum nano-structure array (limited-length quantum wire array and quantum dot array) provided by this invention allows the wavelength range to be enlarged. Since the array obviates the necessity for re-growth and permits use of a mixed crystal incorporating an Al composition of a large band gap as a clad layer, it is made possible to manufacture a laser not easily affected by the operating temperature (endowed with a high To) and materialize a laser of a stabilized wavelength which is suitably applied to products for general use, such as household appliances and automobiles, which allow rigid control of temperature conditions only with difficulty.

The invention claimed is:

1. A quantum nano-structure semiconductor laser comprising:
   a grooved semiconductor substrate having a plurality of V-grooves individually extended in directions perpendicular to a direction of advance of an oscillated laser beam and mutually disposed in parallel along the direction of advance of the laser beam; and
   a plurality of quantum wires formed one on each of the V-grooves by selective growth of a Group III-V compound, said plurality of quantum wires being
      disposed in parallel along the direction of advance of the laser beam with a period of an integer times of a quarter wavelength in a medium of a laser active layer and
      individually closed at both ends thereof to form an active layer region of a limited length, which length is equal to a stripe width of the laser.

2. A quantum nano-structure semiconductor laser according to claim 1, wherein a waveguide mode is stabilized by intentionally displacing a period of parallel disposition from said period of an integer times ¼ instead of disposing said plurality of quantum wires in parallel along said direction of advance of the laser beam with a period of an integer times of the quarter wavelength in the medium of the laser active layer for a broadband wavelength oscillation or short pulse oscillation in a state of mode lock is materialized by promoting compensation of dispersion between oscillation modes.

3. A quantum nano-structure semiconductor laser according to claim 1 or claim 2, wherein said substrate is a GaAs (100) or (311)A substrate; said V-grooves are limited-length V-grooves formed in a [01-1] direction on the GaAs (100) or (311)A substrate; said quantum wires are limited-length wires manufactured from GaAs or InGaAs and grown on said limited-length V-grooves; and said quantum wires are individually furnished with GaAs or AlGaAs clad regions adapted to cover said quantum wires.

4. A quantum nano-structure semiconductor laser according to claim 1 or claim 2, wherein said substrate is an InP (100) or (311)A substrate; said V-grooves are limited-length V-grooves formed in a [01-1] direction on the InP (100) or (311)A substrate; said quantum wires are limited-length wires manufactured from InGaAs and grown on said limited-length V-grooves, and said quantum wires are furnished with InAlAs clad areas adapted to cover said quantum wires.

5. A quantum nano-structure semiconductor laser comprising:
   a grooved Group III-V compound semiconductor substrate having a plurality of V-grooves individually extended in directions perpendicular to a direction of advance of an oscillated laser beam and mutually disposed in parallel along said direction of advance of the laser beam with a period of an integer times of a quarter wavelength in a medium of a laser active layer;
   a plurality of InGaAs or InAs quantum dots formed one in each of base parts of said V-grooves by growing InGaAs or InAs on said V-grooves to not less than a critical film thickness, said plurality of quantum dots forming an active layer region of a limited length, which length is equal to a stripe width of the laser; and GaAs or AlGaAs layers on said active layer region serving as clad regions.

6. A quantum nano-structure semiconductor laser according to claim 5, wherein a waveguide mode is stabilized by intentionally displacing said period of parallel disposition from said period of an integer times ¼ instead of disposing the period of parallel disposition of said plurality of V-grooves at an integer times of the quarter wavelength in the medium of said laser active layer, for a broadband wavelength oscillation or short pulse oscillation in a state of mode lock is materialized by promoting compensation for dispersion between oscillation modes.

7. A quantum nano-structure semiconductor laser according to claim 5 or claim 6, wherein said grooved Group III-V compound substrate is a GaAs (100) or (311)A substrate or an InP (100) or (311)A substrate.

8. A quantum nano-structure semiconductor laser according to claim 5 or claim 6, wherein a structure having said quantum dots formed therein is mesa-etched to be transformed into a distributed feedback laser.

9. A quantum nano-structure semiconductor laser according to claim 5 or claim 6, wherein a structure having said quantum dots formed therein has lateral surfaces along said direction of the laser beam imparted with corrugations to be transformed into a distributed feedback laser.

10. A quantum nano-structure semiconductor layer according to claim 5 or claim 6, wherein a structure having said quantum dots formed therein has a plurality of through holes bored therein with a prescribed period along lateral sides leaving behind stripe parts for passing light and along vertical directions individually perpendicular to both said direction of advance of the laser beam and a lateral direction perpendicular thereto.

11. A quantum nano-structure semiconductor laser according to claim 10, wherein said period is ½ of the wavelength in the medium.

* * * * *